(12) United States Patent
Matsunaga

(10) Patent No.: US 7,764,235 B2
(45) Date of Patent: Jul. 27, 2010

(54) SEMICONDUCTOR DEVICE

(75) Inventor: Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/182,696

(22) Filed: Jul. 30, 2008

(65) Prior Publication Data

US 2008/0291092 A1    Nov. 27, 2008

Related U.S. Application Data

(63) Continuation of application No. 11/280,860, filed on Nov. 17, 2005, now abandoned.

(30) Foreign Application Priority Data

Jul. 27, 2005  (JP)  ............................. 2005-217688

(51) Int. Cl.
*H01Q 1/38* (2006.01)
*H01Q 9/28* (2006.01)

(52) U.S. Cl. ................. 343/700 MS; 343/795

(58) Field of Classification Search .......... 343/700 MS, 343/795, 873, 893
See application file for complete search history.

(56) References Cited

U.S. PATENT DOCUMENTS

| 5,621,913 A | 4/1997 | Tuttle et al. |
|---|---|---|
| 5,661,286 A | 8/1997 | Fujioka |
| 5,710,172 A | 1/1998 | Kukreja et al. |
| 5,710,458 A | 1/1998 | Iwasaki |
| 5,898,909 A * | 4/1999 | Yoshihara et al. ............. 455/73 |
| 6,263,193 B1 | 7/2001 | Iseki et al. |
| 6,373,447 B1 * | 4/2002 | Rostoker et al. ............ 343/895 |
| 6,639,555 B1 * | 10/2003 | Kane et al. ............ 343/700 MS |
| 7,034,751 B2 | 4/2006 | Brown et al. |
| 7,119,745 B2 * | 10/2006 | Gaucher et al. ....... 343/700 MS |
| 7,151,494 B2 | 12/2006 | Brown et al. |
| 2005/0151698 A1 | 7/2005 | Mohamadi |
| 2008/0106469 A1 * | 5/2008 | Kikkawa et al. ...... 343/700 MS |

FOREIGN PATENT DOCUMENTS

| JP | 11-068033 A | 3/1999 |
|---|---|---|
| JP | 2000-099658 A | 4/2000 |
| JP | 2004-327568 A | 11/2004 |
| JP | 2005-094440 A | 4/2005 |

OTHER PUBLICATIONS

K. K. O et al., "Wireless Communications Using Integrated Antennas," Proceedings of the 2003 International Interconnect Technology Conference, Jun. 24, 2003, pp. 111-113.

* cited by examiner

*Primary Examiner*—Shih-Chao Chen
(74) *Attorney, Agent, or Firm*—Foley & Lardner LLP

(57) ABSTRACT

A semiconductor device includes a first level layer, a transmitting antenna provided on the first level layer and extending in a first direction, a receiving antenna provided on the first level layer and extending in the first direction, and a plurality of first wiring portions provided on the first level layer and extending in a second direction that makes an angle of 45 to 90 degrees with respect to the first direction.

13 Claims, 11 Drawing Sheets

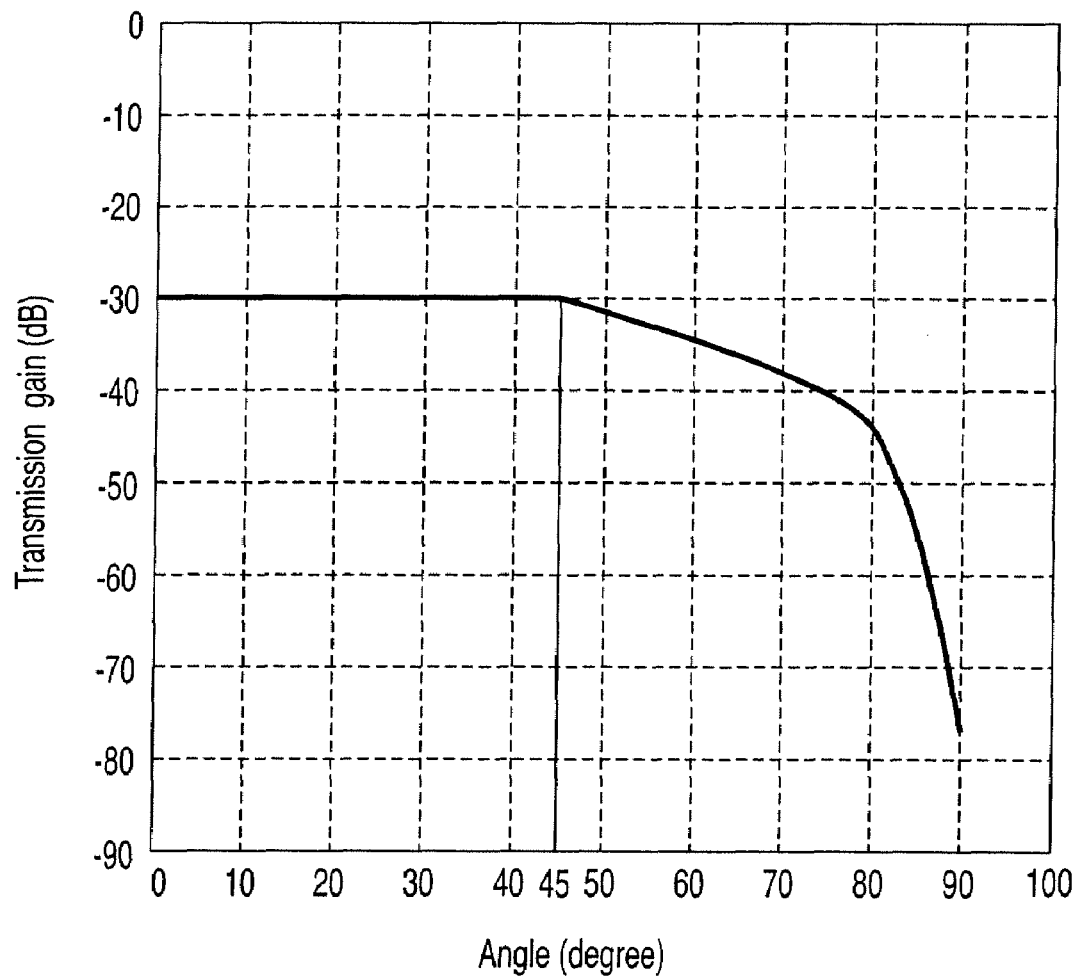
F I G. 3

SEMICONDUCTOR DEVICE

CROSS-REFERENCE TO RELATED APPLICATIONS

The present application is a continuation of U.S. application Ser. No. 11/280,860, filed Nov. 17, 2005, the entire contents of which is incorporated herein by reference.

This application is based upon and claims the benefit of priority from prior Japanese Patent Application No. 2005-217688, filed Jul. 27, 2005, the entire contents of which are incorporated herein by reference.

BACKGROUND OF THE INVENTION

1. Field of the Invention

The present invention relates to a semiconductor device, and more specifically, to a semiconductor device including a transmitting antenna and a receiving antenna.

2. Description of the Related Art

Recently, signals including clock signals are transmitted wirelessly within a chip, and transmission systems of such a wireless mode are being proposed. A semiconductor integrated circuit that can realize such a system includes a transmitting antenna, a receiving antenna, a transmitting circuit connected to the transmitting antenna, a receiving circuit connected to the receiving antenna, etc.

In this semiconductor integrated circuit, a signal is transmitted by means of radio wave from the transmitting antenna to the receiving antenna. Here, radio wave transmitted from the transmitting antenna reaches wirings other than the receiving antenna. Therefore, due to an adverse effect of the radio wave generated by the transmitting antenna, noise is created in the wiring portions, and such noise may become a factor of interference of a signal and malfunction of the semiconductor integrated circuit. In the meantime, there is a demand of further downsizing the semiconductor integrated circuits; however, the adverse effect of the noise conflicts the demand of downsizing the semiconductor integrated circuits, and it becomes more serious as the antennas and circuits are formed closer to each other.

As a technology related to the above-described type, a system module that carries out stable communications has been proposed. (See Jpn. Pat. Appln. KOKAI Publication No. 11-68033.)

BRIEF SUMMARY OF THE INVENTION

According to a first aspect of the present invention, there is provided a semiconductor device comprising: a first level layer; a transmitting antenna provided on the first level layer and extending in a first direction; a receiving antenna provided on the first level layer and extending in the first direction; and a plurality of first wiring portions provided on the first level layer and extending in a second direction that makes an angle of 45 to 90 degrees with respect to the first direction.

According to a second aspect of the present invention, there is provided a semiconductor device comprising: a transmitting loop antenna; a receiving loop antenna; and a plurality of first wiring portions each extending in a linear manner.

According to a third aspect of the present invention, there is provided a semiconductor device comprising: a first level layer; a transmitting antenna provided on the first level layer and extending in a first direction; a receiving antenna provided on the first level layer, extending in the first direction and arranged to be away from the transmitting antenna by a first distance; and a plurality of first wiring portions provided on the first level layer, extending in the first direction and arranged to be away from the transmitting antenna and the receiving antenna by a second distance which is larger than the first distance.

BRIEF DESCRIPTION OF THE SEVERAL VIEWS OF THE DRAWING

FIG. 3 is a diagram illustrating the correlation between the angle of arrangement of a wiring section 15 and the transmission gain;

DETAILED DESCRIPTION OF THE INVENTION

Figure 1:
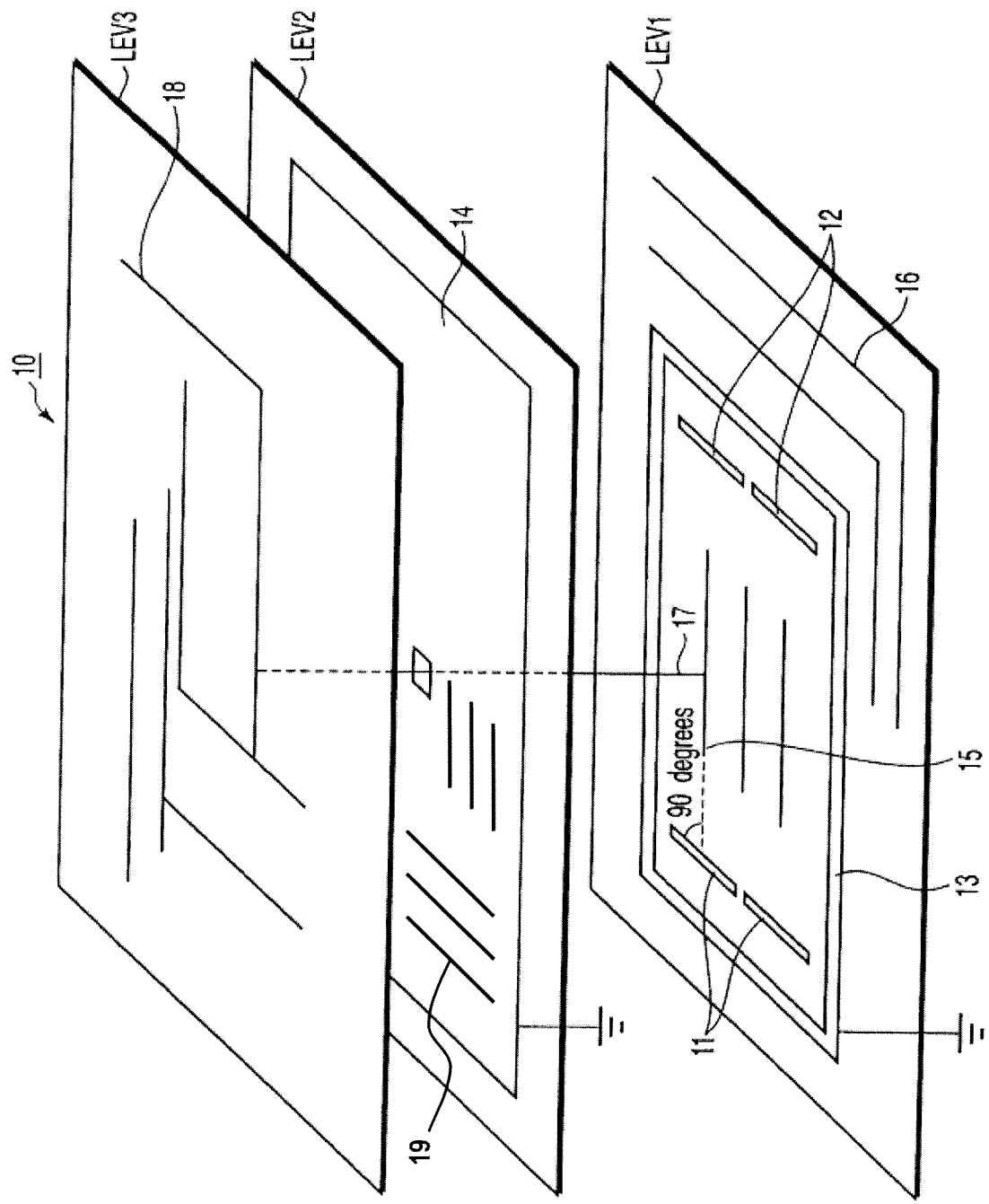
FIG. 1 is a diagram showing the structure of a semiconductor integrated circuit 10 according to the first embodiment of the present invention.

Embodiments of the present invention will now be described with reference to accompanying drawings. In the following explanations, structural elements having the same functions and structures are designated by the same reference numerals, and the explanations therefore will not be repeated unless they are necessary.

First Embodiment

FIG. 1 is a diagram showing the structure of a semiconductor integrated circuit 10 according to the first embodiment of the present invention. The semiconductor integrated circuit 10 includes a transmitting circuit and a receiving circuit. The transmitting circuit includes a transmitting antenna 11 that transmit signals to the receiving circuit, and the receiving circuit includes a receiving antenna 12 that receives signals from the transmitting circuit. Thus, predetermined signals and clock signals are transmitted wirelessly by the transmitting and receiving circuits.

The transmitting antenna 11 is provided to extend in an arbitrary direction. For the transmitting antenna 11, for example, a dipole antenna is employed. More specifically, the transmitting antenna 11 includes a first transmitting antenna element and a second transmitting antenna element. The transmitting antenna 11 is provided in the form of a wiring pattern on a predetermined level layer. However, the form is not limited to this, the transmitting antenna 11 may be of, for example, a rod-, cylinder-, plate-like shape.

The receiving antenna 12 is provided to extend in the extending direction of the transmitting antenna 11. Similarly, for the transmitting antenna 12, for example, a dipole antenna is employed, and the receiving antenna 12 includes a first receiving antenna element and a second receiving antenna element.

The transmitting antenna 11 and receiving antenna 12 are arranged to face each other. That is, the plane of polarization of the transmitting antenna 11 and that of the receiving antenna 12 coincide with each other. With this arrangement, the transmitting antenna 11 and receiving antenna 12 are capacity-coupled with each other. With this structure, transmission of signals can be accurately carried out between the transmitting antenna 11 and the receiving antenna 12. The material for the transmitting antenna 11 and receiving antenna 12 is, for example, Cu or Al.

Figure 2:
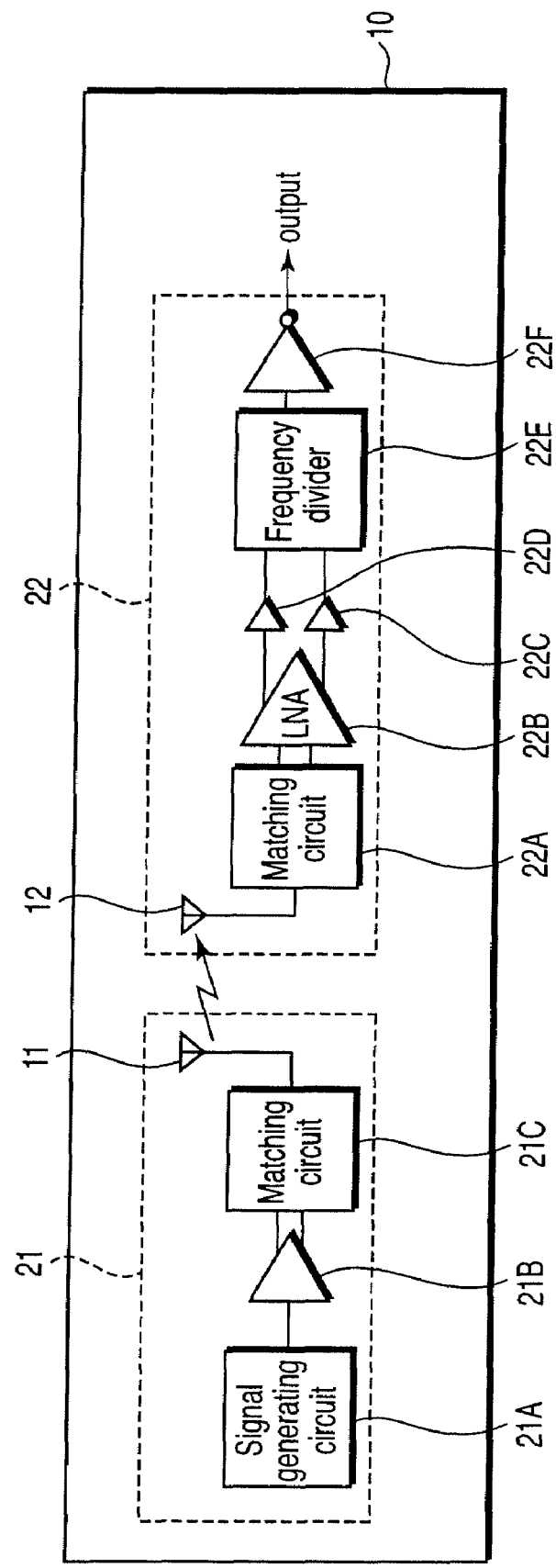
FIG. 2 is a circuit diagram of the semiconductor integrated circuit 10.

Here, an example of the structure of the semiconductor integrated circuit 10 will now be described. FIG. 2 is a circuit diagram of the semiconductor integrated circuit 10. The semiconductor integrated circuit 10 includes a transmitting circuit 21 and a receiving circuit 22.

The transmitting circuit 21 includes a signal generator circuit 21A, an amplifier 21B, a transmission-side matching circuit 21C and the transmitting antenna 11. The signal generator circuit 21A generates signals to be transmitted to, for example, the receiving circuit 22. Signals generated by the signal generating circuit 21A are amplified to a predetermined gain by the amplifier 21B. The signals output from the amplifier 21B are input to the transmission-side matching circuit 21C.

The transmission-side matching circuit 21C carries out impedance matching for the signals to efficiently achieve electrical coupling between the transmitting circuit 21 and receiving circuit 22. The signals output from the transmission-side matching circuit 21C are transmitted in the form of radio wave to the receiving circuit 22 through the transmitting antenna 11.

The receiving circuit 22 includes the receiving antenna 12, a reception-side matching circuit 22A, a low noise amplifier (LNA) 22B, buffers 22C and 22D, a frequency divider 22E and a sector buffer 22F. The receiving antenna 12 receives radio waves transmitted from the transmitting antenna 11.

Signals received by the receiving antenna 12 are subjected to impedance matching by the reception-side matching circuit 22A. The signals output from the reception-side matching circuit 22A are amplified to a predetermined gain by the low noise amplifier 22B. The signals output from the low noise amplifier 22B are input to the frequency divider 22E via the buffers 22C and 22D. The frequency divider 22E carries out frequency conversion onto the signals. The signals output from the frequency divider 22E are output from the receiving circuit 22 via the sector buffer 22F.

As shown in FIG. 1, the semiconductor integrated circuit 10 has a multilayer structure of a plurality of levels, and these level layers include a first level layer LEV1, a second level layer LEV2 formed via an interlayer insulating film (not shown) on the first level layer LEV1, and a third level layer LEV3 formed via an interlayer insulating film (not shown) on the second level layer LEV2. These level layers are provided on, for example, a semiconductor substrate (not shown).

The receiving antenna 12 and the transmitting antenna 11 are provided on, for example, the first level layer LEV1. The first level layer LEV1 is provided with a shield layer 13. The shield layer 13 is formed to surround the receiving antenna 12 and the transmitting antenna 11. The shield layer 13 is formed as a wiring pattern as in the case of the antennas. The shield layer 13 is connected to a fixed potential (for example, the ground potential). The fixed potential is not limited to the ground potential, but it may be the power potential, or the like. Examples of the material of the shield layer 13 are Cu and Al.

The semiconductor integrated circuit 10 includes a plurality of wiring portions 15, 16 and 18. The wiring portions 15, 16 and 18 correspond to the wirings that form the circuit shown in FIG. 2. Examples of the material of the shield layer 13 are Cu and Al. It should be noted that in FIG. 1, the wiring portions 15, 16 and 18 are drawn by lines for simplification, but in reality, they are wiring layers each having a certain wiring width.

The wiring portions 15 are provided on an inner side to the shield layer 13. Further, the wiring portions 15 are arranged to have an angle of, for example, 90 degrees with respect to the transmitting antenna 11 and the receiving antenna 12.

FIG. 3 is a diagram illustrating the correlation between the angle of arrangement of the wiring portion 15 and the transmission gain. The horizontal axis indicates the angle (degree) between the transmitting antenna 11 (or the receiving antenna 12) and the wiring portion 15. The vertical axis indicates the transmission gain (dB) of a signal transmitted in the wiring portion 15. It should be noted that the frequency of the signal transmitted between the transmitting antenna 11 and the receiving antenna 12 is, for example, 30 GHz.

As can be understood from FIG. 3, the transmission gain of the case of 90 degrees of angle is decreased by a maximum amount as compared to the case where the angle is 0 degree (that is, the transmitting antenna 11 and the wiring portion 15 are in parallel with each other). This is because the transmitting antenna 11 or the receiving antenna 12 and the wiring portion 15 which is arranged at an angle of 90 degrees with respect to the transmitting antenna 11 or the receiving antenna 12 do not coincide with each other in plane of polarization. With this arrangement, it is not possible for the wiring portion 15 to receive radio wave generated from the transmitting antenna 11. For the same reason, it is not possible for the receiving antenna 12 to receive radio wave generated from the wiring portion 15. In this manner, the interference between the transmitting antenna 11 or the receiving antenna 12 and the wiring portion 15 can be suppressed.

Further, as can be understood from FIG. 3, when the angle between the transmitting antenna 11 or the receiving antenna 12 and the wiring portion 15 is 45 degrees or larger, the transmission gain is decreased. Therefore, when the angle is in a range between 45 and 90 degrees, the interference between the transmitting antenna 11 or the receiving antenna 12 and the wiring portion 15 can be suppressed.

The wiring portions 16 are arranged on an outer side to the shield layer 13 on the first level layer LEV1. Further, the wiring portions 16 are arranged to be in parallel with the transmitting antenna 11 and the receiving antenna 12. That is, all the wiring portions that are in parallel with the transmitting antenna 11 and the receiving antenna 12 on the first level layer LEV1 are arranged on an outer side of the shield layer 13.

The shield layer 13 serves to shut the radio wave generated from the transmitting antenna 11. Further, the shield layer 13 serves to shut the radio wave generated from the wiring portions 16. In this manner, the interference between the transmitting antenna 11 or the receiving antenna 12 and the wiring portions 16 can be suppressed.

Each of the wiring portions 18 that contains a wiring segment arranged in parallel with the transmitting antenna 11 and receiving antenna 12 is provided on the third level layer LEV3. The wiring portions 18 are connected to the wiring portions 15 via the wiring portion 17.

The second level layer LEV2 equipped with the shield layer 14 is provided between the first level layer LEV1 and the third level layer LEV3. The shield layer 14 is arranged at least above the transmitting antenna 11 and receiving antenna 12. Further, the shield layer 14 is connected to a fixed potential (for example, the ground potential). The fixed potential is not limited to the ground potential, but it may be a power potential or the like. Examples of the material for the shield layer 14 are Cu and Al.

The shield layer 14 is made of a plate of, for example, a metal. Alternatively, the shield layer 14 may have a shape of lattice with gaps that is smaller than wavelengths of signals. Specifically, the shield layer 14 may have a plurality of wiring portions 19, which are arranged in vertical and horizontal directions. Alternatively, the shield layer 14 may have a shape of lines with gaps that is smaller than wavelengths of signals. Specifically, the shield layer 14 may have a plurality of wiring portions, which are arranged in parallel to each other with intervals such as described above between adjacent lines.

The shield layer 14 serves to shut the radio wave generated in an upward direction from the transmitting antenna 11. Further, the shield layer 14 serves to shut the radio wave generated in a downward direction from the wiring portions 18. In this manner, the interference between the transmitting antenna 11 or the receiving antenna 12 and the wiring portions 18 can be suppressed.

As describe above, according to the embodiment of the present invention, the interference between the transmitting antenna 11 or the receiving antenna 12 and the wiring portion, if it may be arranged in any direction, can be suppressed. Thus, it becomes possible to form a semiconductor integrated circuit that can transmit signals in an accurate manner.

It should be noted that the shield layer 13 may not necessarily surround the transmitting antenna 11 and the receiving antenna 12 in their entirety. In other words, it suffices only if the shield layer 13 is arranged between the transmitting antenna 11 or the receiving antenna 12 and the wiring portions set in parallel to the antenna. With the above-described arrangement of the shield layer 13 as well, a similar advantageous effect to the above-described embodiment can be obtained.

In the case where wiring portions and the like are formed in a layer that is located at a level lower than that of the first level layer LEV1 where the transmitting antenna 11 and the receiving antenna 12 are provided, a shield layer should be provided therebetween. In this manner, the interference between the transmitting antenna 11 or the receiving antenna 12 and the wirings of the lower layer can be suppressed.

Second Embodiment

The second embodiment is designed to suppress the interference that may occur during signal transmission by means of loop antennas in a semiconductor integrated circuit.

Figure 4:
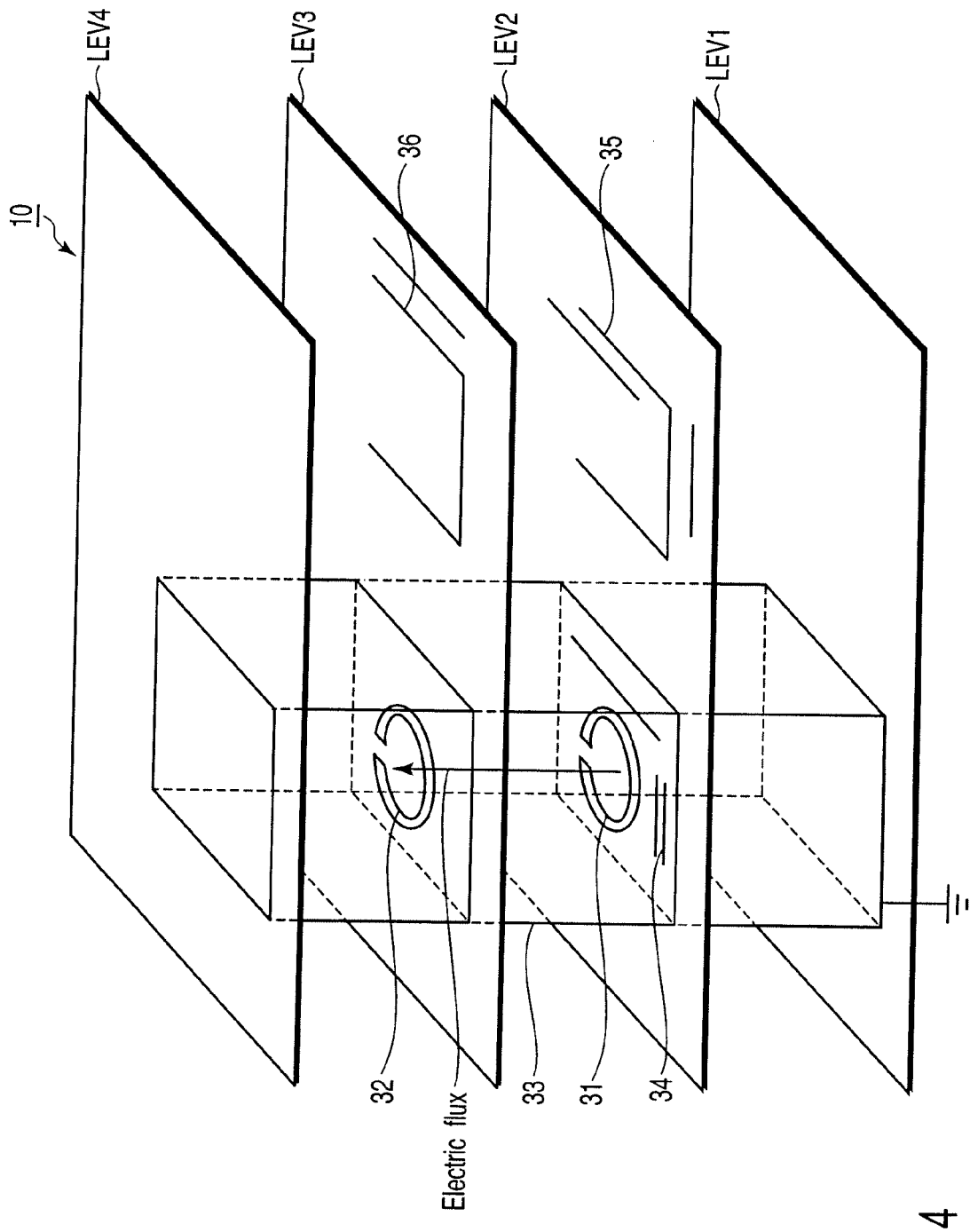
FIG. 4 is a diagram showing the structure of a semiconductor integrated circuit 10 according to the second embodiment of the present invention.

FIG. 4 is a diagram showing the structure of the semiconductor integrated circuit 10 according to the second embodiment of the present invention. The circuit structure of the semiconductor integrated circuit 10 is the same as that shown in the circuit diagram of FIG. 2.

As shown in FIG. 4, the semiconductor integrated circuit 10 has a multilayer structure of a plurality of levels, and these level layers include a first level layer LEV1, a second level layer LEV2 formed via an interlayer insulating film (not shown) on the first level layer LEV1, a third level layer LEV3 formed via an interlayer insulating film (not shown) on the second level layer LEV2, and a fourth level layer LEV4 formed via an interlayer insulating film (not shown) on the third level layer LEV3. These level layers are provided on, for example, a semiconductor substrate (not shown).

The semiconductor integrated circuit 10 includes a transmitting loop antenna 31 and a receiving loop antenna 32. In this embodiment, loop antennas are used in place of ordinary antennas. The shape of the plane of each loop antenna is, for example, circular, but it is not limited to this, but it may be quadrilateral or polygonal, etc. Examples of the material of the transmitting loop antenna 31 and a receiving loop antenna 32 are Cu and Al.

The transmitting loop antenna 31 is provided on the second level layer LEV2. The receiving loop antenna 32 is provided on the third level layer LEV3. Further, the receiving loop antenna 32 is located above the transmitting loop antenna 31. The transmitting loop antenna 31 and the receiving loop antenna 32 are inductively coupled with each other. With this structure, radio wave (or electric flux) generated in an upward direction from the transmitting loop antenna 31 is received by the receiving loop antenna 32, and thus the semiconductor integrated circuit 10 carries out signal transmission.

The semiconductor integrated circuit 10 includes a shield layer 33. The shield layer 33 is provided to sterically surround (enclose) the transmitting loop antenna 31 and the receiving loop antenna 32. In this embodiment, the shield layer 33 has, for example, a rectangular parallelepiped shape. The shield layer 33 is connected to a fixed potential (for example, the ground potential). The fixed potential is not limited to the ground potential, but it may be the power potential, or the like. Examples of the material of the shield layer 33 are Cu and Al.

Figure 5:
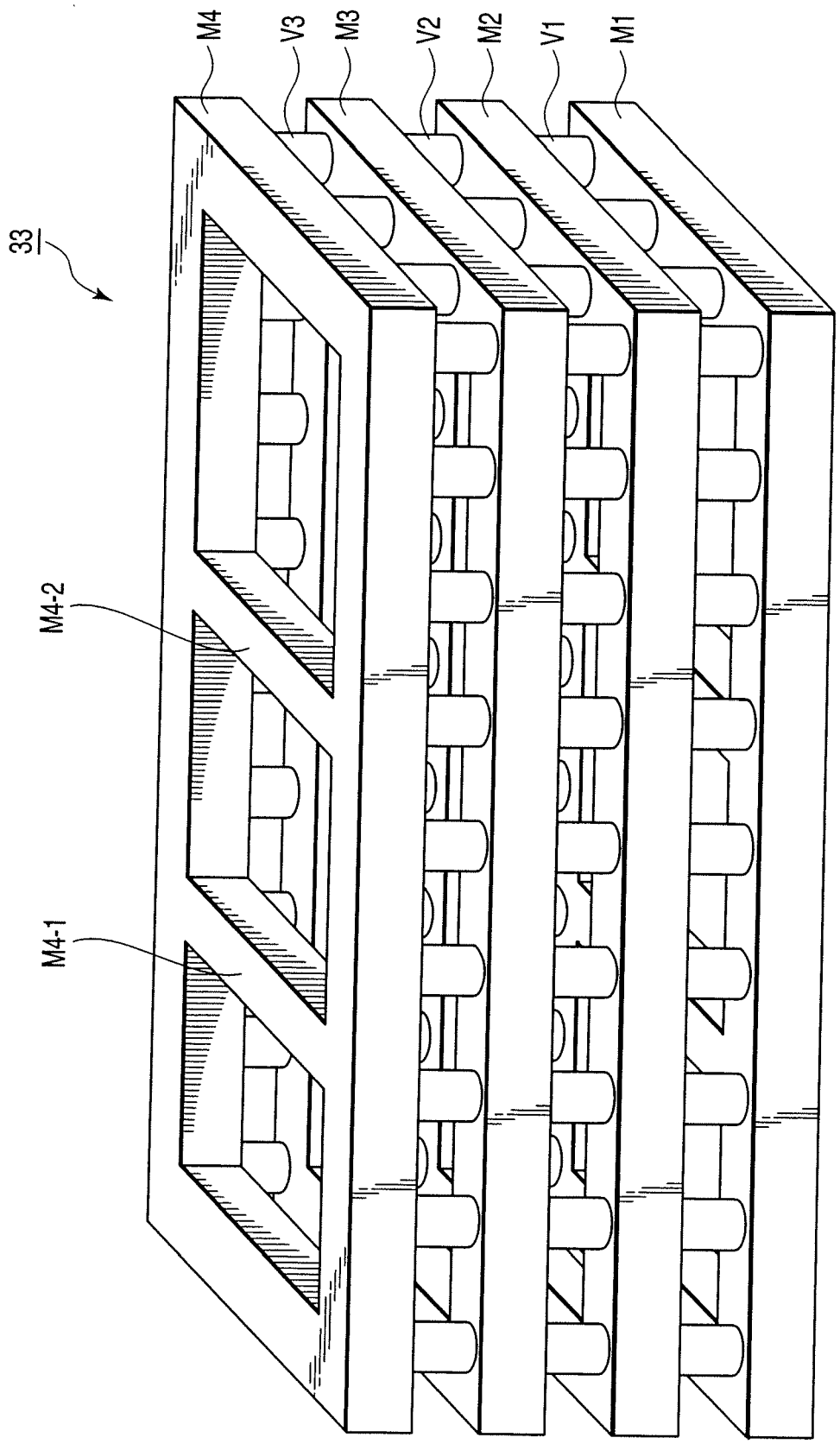
FIG. 5 is a perspective view showing an example of the structure of a shield layer 33 shown in FIG. 4.

FIG. 5 is a perspective view of an example of the structure of the shield layer 33 shown in FIG. 4. The shield layer 33 includes a first metal layer M1 provided in the first level layer LEV1, a second metal layer M2 provided in the second level layer LEV2, a third metal layer M3 provided in the third level layer LEV3 and a fourth metal layer M4 provided in the fourth level layer LEV4.

Further, the shield layer 33 includes first via plugs V1 provided in the interlayer insulating film formed between the first level layer LEV1 and the second level layer LEV2, and electrically connecting the first metal layer M1 and the second metal layer M2 to each other, second via plugs V2 provided in the interlayer insulating film formed between the second level layer LEV2 and the third level layer LEV3, and electrically connecting the second metal layer M2 and the third metal layer M3 to each other, and third via plugs V3 provided in the interlayer insulating film formed between the third level layer LEV3 and the fourth level layer LEV4, and electrically connecting the third metal layer M3 and the fourth metal layer M4 to each other.

The fourth metal layer M4 comprises a plurality of metal layer sections that extend in one direction. FIG. 5 shows an example in which the fourth metal layer M4 comprises two metal layer sections M4-1 and M4-2, but it is only natural that the number of metal layer sections is two or more. Furthermore, the fourth metal layer M4 may be of a lattice-like shape, or a mesh-like shape. The first metal layer M1 can be modified in a similar manner to the above.

An example of the method of manufacturing the shield layer 33 will now be described. The first metal layer M1 is formed by, for example, a damascene method. More specifically, a groove is formed in an interlayer insulating film and the groove is filled with a conductive material such as Cu. Then, the upper surface of the first metal layer M1 is planarized by a CMP (chemical mechanical polishing) method.

Further, the second metal layer M2 and the via plug V1 are formed by a dual damascene method. More specifically, a groove for the second metal layer M2 and a plurality of openings for the via plug V1, which expose the first metal layer M1 are formed in an interlayer insulating film and the groove and the openings are filled with a conductive material such as Cu. Then, the upper surface of the second metal layer M2 is planarized by the CMP method. The third metal layer M3, the fourth metal layer M4, etc. are formed in a similar manner to that described above.

Figure 6:
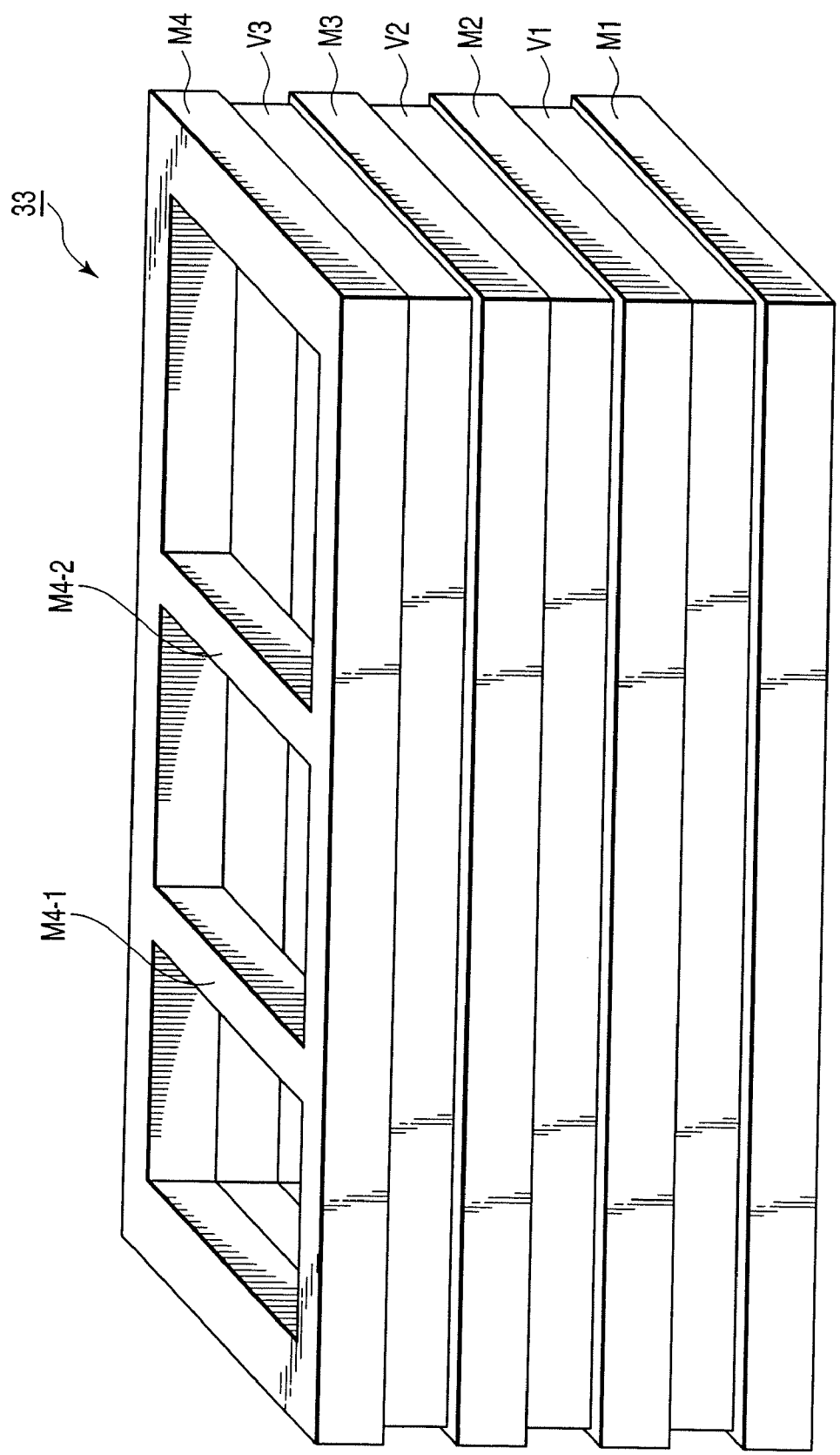
FIG. 6 is a perspective view showing another example of the structure of the shield layer 33 shown in FIG. 4.

FIG. 6 is a perspective view showing another example of the structure of the shield layer 33. This example of the shield layer 33 includes the via metal layer V1 that electrically connects the first metal layer M1 and the second metal layer M2 to each other. The via metal layer V1 is provided to surround the inner side of the shield layer 33. The via metal layers V2 and V3 are formed in a similar manner to the above.

As shown in FIG. 4, wiring portions 34 that are not in a loop shape is provided in an inner side of the shield layer 33 on the second level layer LEV2. Each of the wiring portions 34 is, for example, a straight line. Alternatively, the wiring portion 34 may be of an L-letter shape. That is, the wiring portion 34 includes a first wiring segment that is in a straight line and a second wiring segment that is orthogonal to the first wiring segment and in a straight line, and the first wiring segment and the second wiring segment are connected to each other. Further, the wiring portion 34 may be formed by connecting the two straight line portions at an arbitrary angle.

With this structure, the inductive coupling between the transmitting loop antenna 31, the receiving loop antenna 32 and the wiring portions 34 is extremely weak. Consequently, the interference between the transmitting loop antenna 31, the receiving loop antenna 32 and the wiring portions 34 can be suppressed. It should be noted that the wiring portion 34 made of straight line segments may be provided on an inner side to the shield layer 33 on the third level layer LEV3.

On an outer side to the shield layer 33 on the second level layer LEV2, a loop-shaped wiring portions 35 are provided. In other words, each of the wiring portions 35 includes at least two wiring segments each arranged in substantially parallel with the tangent line of the transmitting loop antenna 31 and one wiring segment that electrically connects these two wiring segments. It should be noted that arrangement of the two wiring segments is not limited to a parallel fashion, but it suffices only if the wiring portions have a vector component of the same direction as the extending direction of the tangent line.

On an outer side to the shield layer 33 on the third level layer LEV3, a loop-shaped wiring portions 36 are provided. Similarly, each of the wiring portions 36 includes at least two wiring segments each arranged in substantially parallel with the tangent line of the transmitting loop antenna 31 and one wiring segment that electrically connects these two wiring segments.

In the semiconductor integrated circuit 10 having the above-described structure, the shield layer 33 can shut the radio wave generated from the transmitting loop antenna 31. With this structure, the interference between the transmitting loop antenna 31 and the wiring portions 35 or 36 can be suppressed.

Further, the shield layer 33 can shut the radio wave generated from the wiring portions 35 or 36. With this structure, the interference between the transmitting loop antenna 11 and the wiring portions 35 or 36 can be suppressed.

As described above in detail, according to this embodiment, the transmitting loop antenna 31 and the receiving loop antenna 32 are surrounded by the shield layer 33. Further, the loop-shaped wiring portion is placed on the outer side to the shield layer 33. With this structure, the interference of signal within the semiconductor integrated circuit can be suppressed, and therefore it is possible to achieve a semiconductor integrated circuit that can accurately transmit signals.

It should be noted that the shield layer 33 may not necessarily surround the entireties of the transmitting loop antenna 31 and the receiving loop antenna 32. In other words, it suffices if the shield layer 33 is provided between the transmitting and receiving loop antennas 31 and 32, and the loop-shaped wiring portions 35. For example, in the semiconductor integrated circuit 10 shown in FIG. 4, the wiring portions 35 and 36 are arranged to be adjacent to each other in an arbitrary direction with respect to the transmitting loop antenna 31 and the receiving loop antenna 32. In this case, it suffices only if a shield layer 33 of a planar shape extending in a vertical direction to the level layers is provided between a group of the transmitting loop antenna 31 and the receiving loop antenna 32 and a group of the wiring portions 35 and 36. With this arrangement of the shield layer 33, a similar advantageous effect to that of this embodiment can be obtained.

Third Embodiment

The third embodiment is designed to suppress the interference in a semiconductor integrated circuit that includes a transmitting loop antenna 31 and a receiving loop antenna 32 formed on the same level layer.

Figure 7:
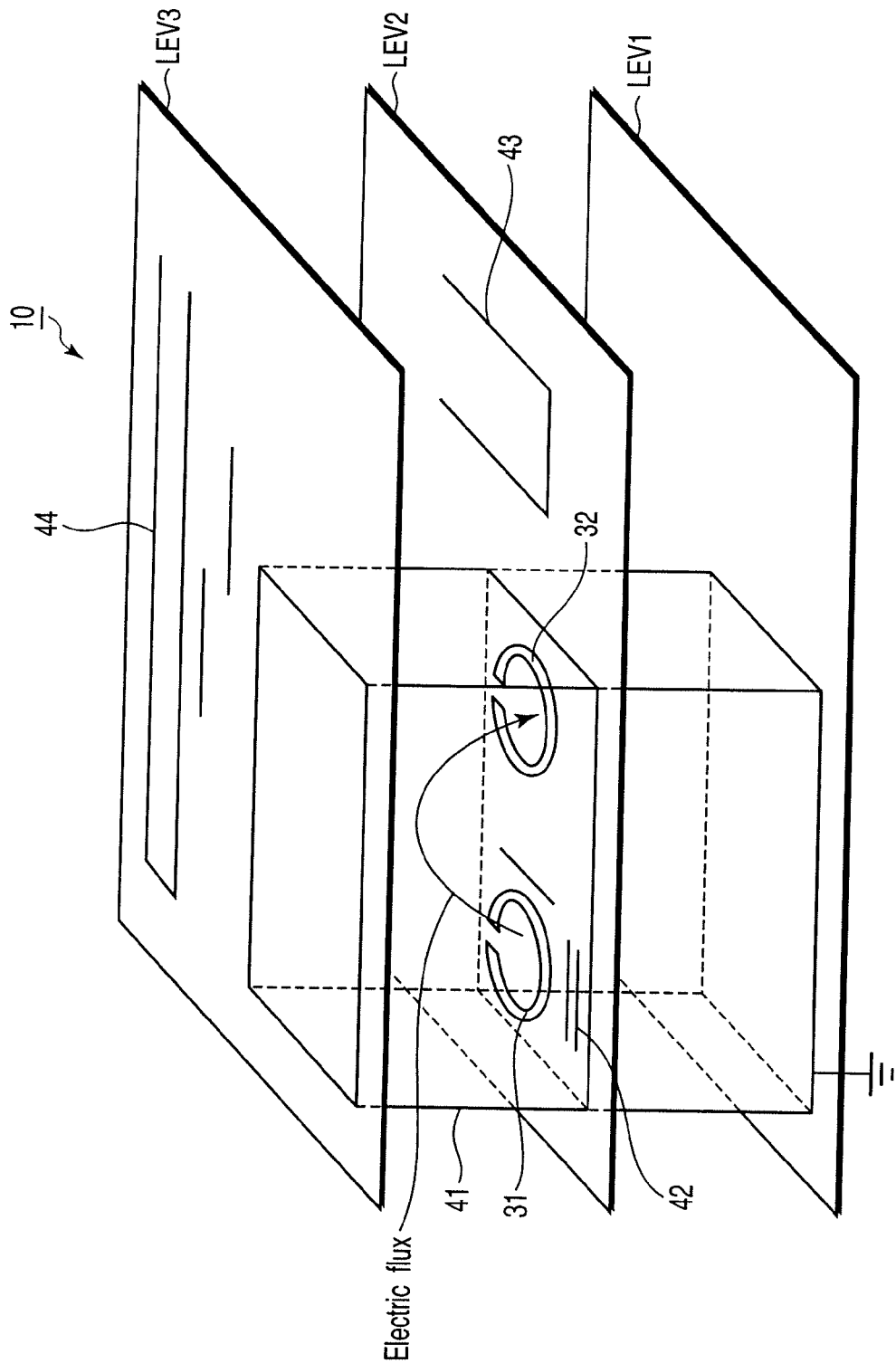
FIG. 7 is a diagram showing the structure of a semiconductor integrated circuit 10 according to the third embodiment of the present invention.

FIG. 7 is a diagram showing the structure of the semiconductor integrated circuit 10 according to the third embodiment of the present invention. The circuit structure of the semiconductor integrated circuit 10 is the same as that shown in the circuit diagram of FIG. 2.

As shown in FIG. 7, the semiconductor integrated circuit 10 has a multilayer structure of a plurality of levels, and these level layers include a first level layer LEV1, a second level layer LEV2 formed via an interlayer insulating film (not shown) on the first level layer LEV1, and a third level layer LEV3 formed via an interlayer insulating film (not shown) on the second level layer LEV2. These level layers are provided on, for example, a semiconductor substrate (not shown).

The semiconductor integrated circuit 10 includes a transmitting loop antenna 31 and a receiving loop antenna 32. In this embodiment, the transmitting loop antenna 31 and the receiving loop antenna 32 are formed on the second level layer LEV2.

The semiconductor integrated circuit 10 includes a shield layer 41. The shield layer 41 is provided to sterically surround (enclose) the transmitting loop antenna 31 and the receiving loop antenna 32. The structure of the shield layer 41 is the same as that of the shield layer 33 except for its measurements (height, width, etc.)

That is, the shield layer 41 includes a first metal layer M1 made of, for example, a plate, and provided in the first level layer LEV1, a second metal layer M2 provided in the second level layer LEV2 and surrounding the transmitting loop antenna 31 and the receiving loop antenna 32, and a third metal layer M3 made of, for example, a plate, and provided in the third level layer LEV3.

Further, the shield layer 41 includes first via plugs V1 provided in the interlayer insulating film formed between the first level layer LEV1 and the second level layer LEV2, and electrically connecting the first metal layer M1 and the second metal layer M2 to each other, and second via plugs V2 provided in the interlayer insulating film formed between the second level layer LEV2 and the third level layer LEV3, and electrically connecting the second metal layer M2 and the third metal layer M3 to each other. The shield layer 41 is connected to a fixed potential (for example, the ground potential).

Figure 8:
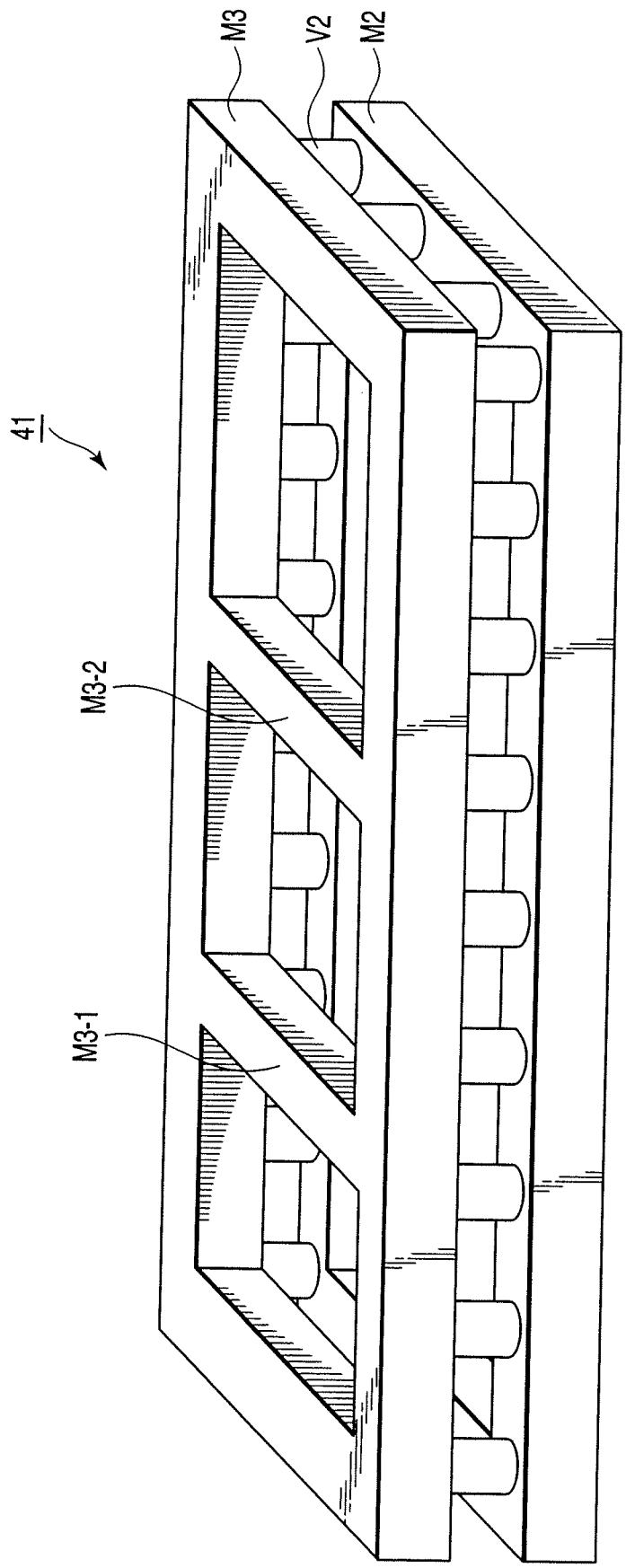
FIG. 8 is a perspective view showing an example of the structure of a shield layer 41 shown in FIG. 7.
Figure 9:
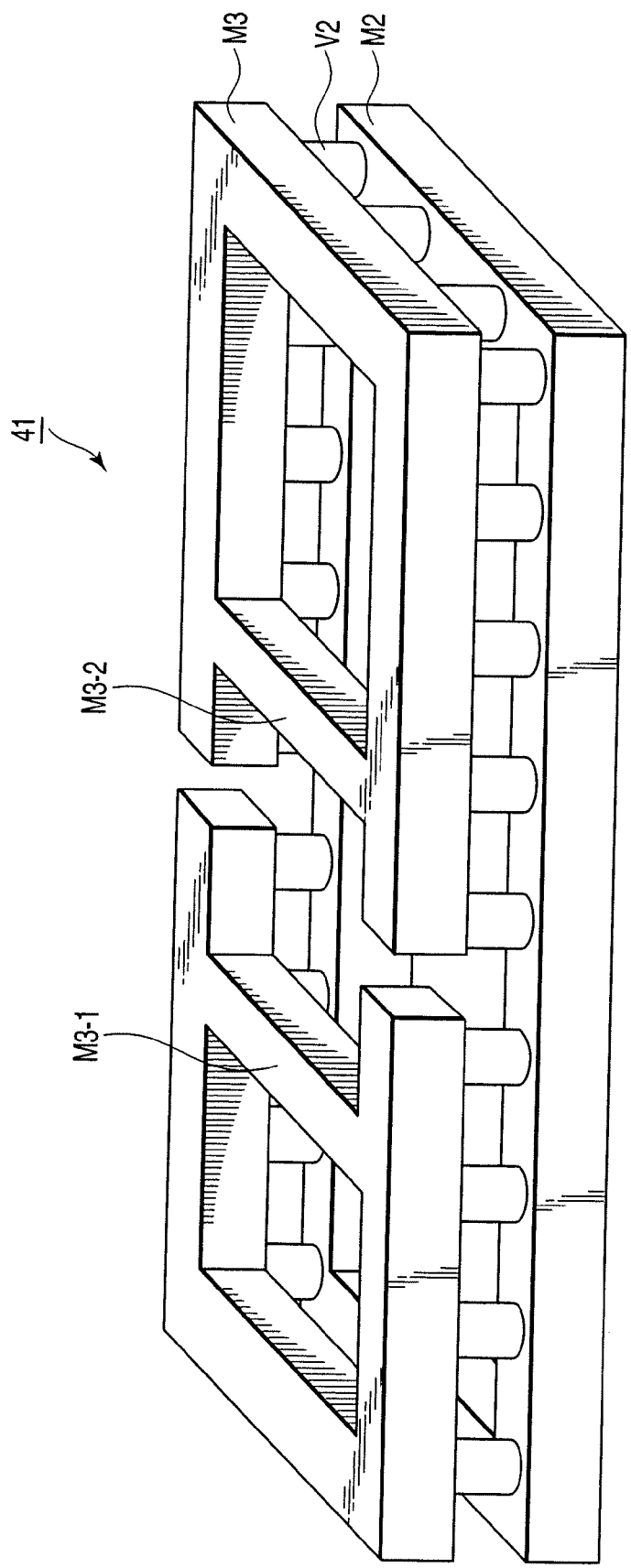
FIG. 9 is a perspective view showing another example of the structure of the shield layer 41 shown in FIG. 7.

As shown in FIG. 8, the shield layer 41 may be formed of two level layers. Further, as shown in FIG. 9, the third metal layer M3, which is the upper surface of the shield layer 41 may be partially cut.

As shown in FIG. 7, wiring portions 42 that are not in a loop shape (but, for example, a straight line) are provided in an inner side of the shield layer 41 on the second level layer LEV2. With this structure, the inductive coupling between the transmitting loop antenna 31, the receiving loop antenna 32 and the wiring portions 42 is extremely weak. Consequently, the interference between the transmitting loop antenna 31, the receiving loop antenna 32 and the wiring portions 34 can be suppressed.

On an outer side to the shield layer 41 on the second level layer LEV2, a loop-shaped wiring portions 43 are provided. In other words, each of the wiring portions 43 includes at least two wiring segments each arranged in substantially parallel with the tangent line of the transmitting loop antenna 31 and one wiring segment that electrically connects these two wiring segments. It should be noted that arrangement of the two wiring segments is not limited to a parallel fashion, but it suffices only if the two wiring segments have a vector component of the same direction as the extending direction of the tangent line.

On an outer side to the shield layer 41 on the third level layer LEV3, a loop-shaped wiring portions 44 are provided. Similarly, each of the wiring portions 44 includes at least two wiring segments each arranged in substantially parallel with the tangent line of the transmitting loop antenna 31 and one wiring segment that electrically connects these two wiring segments.

In the semiconductor integrated circuit 10 having the above-described structure, the shield layer 41 can shut the radio wave generated from the transmitting loop antenna 31. With this structure, the interference between the transmitting loop antenna 31 and the wiring portions 43 or 44 can be suppressed.

Further, the shield layer 41 can shut the radio wave generated from the wiring portions 43 or 44. With this structure, the interference between the transmitting loop antenna 32 and the wiring portions 43 or 44 can be suppressed.

As described above in detail, according to this embodiment, the transmitting loop antenna 31 and the receiving loop antenna 32 are provided on the same level layer. Even in such a case, the interference between a group of the transmitting ore receiving loop antenna 31 or 32 and the loop-shaped wiring portion can be suppressed.

Fourth Embodiment

The fourth embodiment is designed to suppress the interference by setting the interval between a group of a transmitting antenna 11 and a receiving antenna 12 and a group of wiring portions arranged to be in parallel to these antennas to a certain distance or more.

Figure 10:
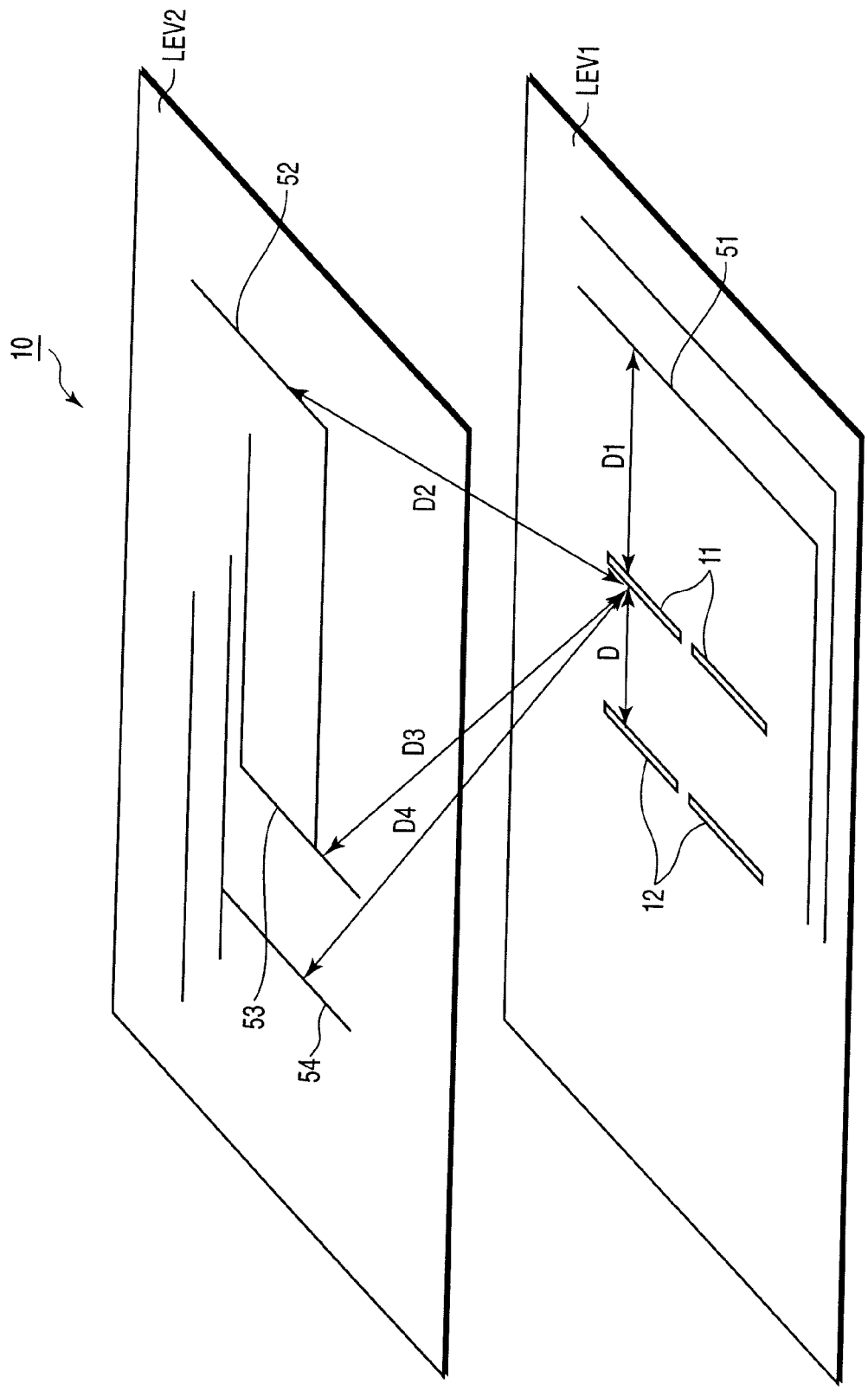
FIG. 10 is a diagram showing the structure of a semiconductor integrated circuit 10 according to the fourth embodiment of the present invention.

FIG. 10 is a diagram showing the structure of the semiconductor integrated circuit 10 according to the fourth embodiment of the present invention. The circuit structure of the semiconductor integrated circuit 10 is the same as that shown in the circuit diagram of FIG. 2.

As shown in FIG. 10, the semiconductor integrated circuit 10 has a multilayer structure of a plurality of levels, and these level layers include a first level layer LEV1, a second level layer LEV2 formed via an interlayer insulating film (not shown) on the first level layer LEV1. These level layers are provided on, for example, a semiconductor substrate (not shown).

The semiconductor integrated circuit 10 includes a transmitting antenna 11 and a receiving antenna 12, each of which is of a dipole type. In this embodiment, the transmitting antenna 11 and the receiving antenna 12 are formed on the first level layer LEV1. The transmitting antenna 11 and the receiving antenna 12 are arranged to be in parallel with each other with a distance D provided between them. The distance D is determined in accordance with the frequency of radio wave transmitted from the transmitting antenna 11 to the receiving antenna 12, the intensity of signal transmitted from the transmitting antenna 11, the circuit structure and the like.

Further, wiring portions 51 that are in parallel with the transmitting antenna 11 and the receiving antenna 12 are provided on the first level layer LEV1. The wiring portions 51 are arranged to be away from the transmitting antenna 11 or the receiving antenna 12 by a distance D1.

Furthermore, wiring portions 52, 53 and 54 that are in parallel with the transmitting antenna 11 and the receiving antenna 12 are provided on the second level layer LEV2. Each of the wiring portions 52, 53 and 54 is arranged to be away from the transmitting antenna 11 or the receiving antenna 12 by a respective distance D2, D3 or D4, respectively.

In the meantime, an attenuation G of electromagnetic wave is expressed by the following formula:

$$G \propto A \cdot \exp(-x/k)$$

where x is the distance from the antenna, and A and k are constants.

When antennas are provided in a semiconductor chip, the distance between a transmitting antenna and a receiving antenna is relatively short. Therefore, for simplification, in terms of the capacity coupling between the transmitting antenna and receiving antenna, the coupling capacitance E is expressed by the following formula:

$$E \propto x^{-2}$$

From the relationship expressed by the above formula, the coupling capacitance can be decreased by increasing the distance x. Further, in order to decrease the coupling capacitance to ¼ (25%) or less, the distance x should be increased two times or more.

Thus, in FIG. 10, the distances D1, D2, D3 and D4 are set two times or more of the distance D. With this arrangement, the coupling capacitance between the transmitting antenna 11 and the wiring portions 51, 52, 53 or 54 can be decreased to ¼ or less of the coupling capacitance between the transmitting antenna 11 and the receiving antenna 12. In this manner, the interference between the transmitting antenna 11 and the wiring portions 51, 52, 53 or 54 can be decreased.

This is also the case for the relationship between the receiving antenna 12 and the wiring portions 51, 52, 53 or 54. That is, each of the wiring portions 51, 52, 53 and 54 is located away from the receiving antenna 12 by a distance two times or more of the distance D. With this arrangement, the interference between the receiving antenna 12 and the wiring portions 51, 52, 53 or 54 can be decreased.

Fifth Embodiment

The fifth embodiment is a version in which the present invention is applied to an MCM (multi chip module).

Figure 11:
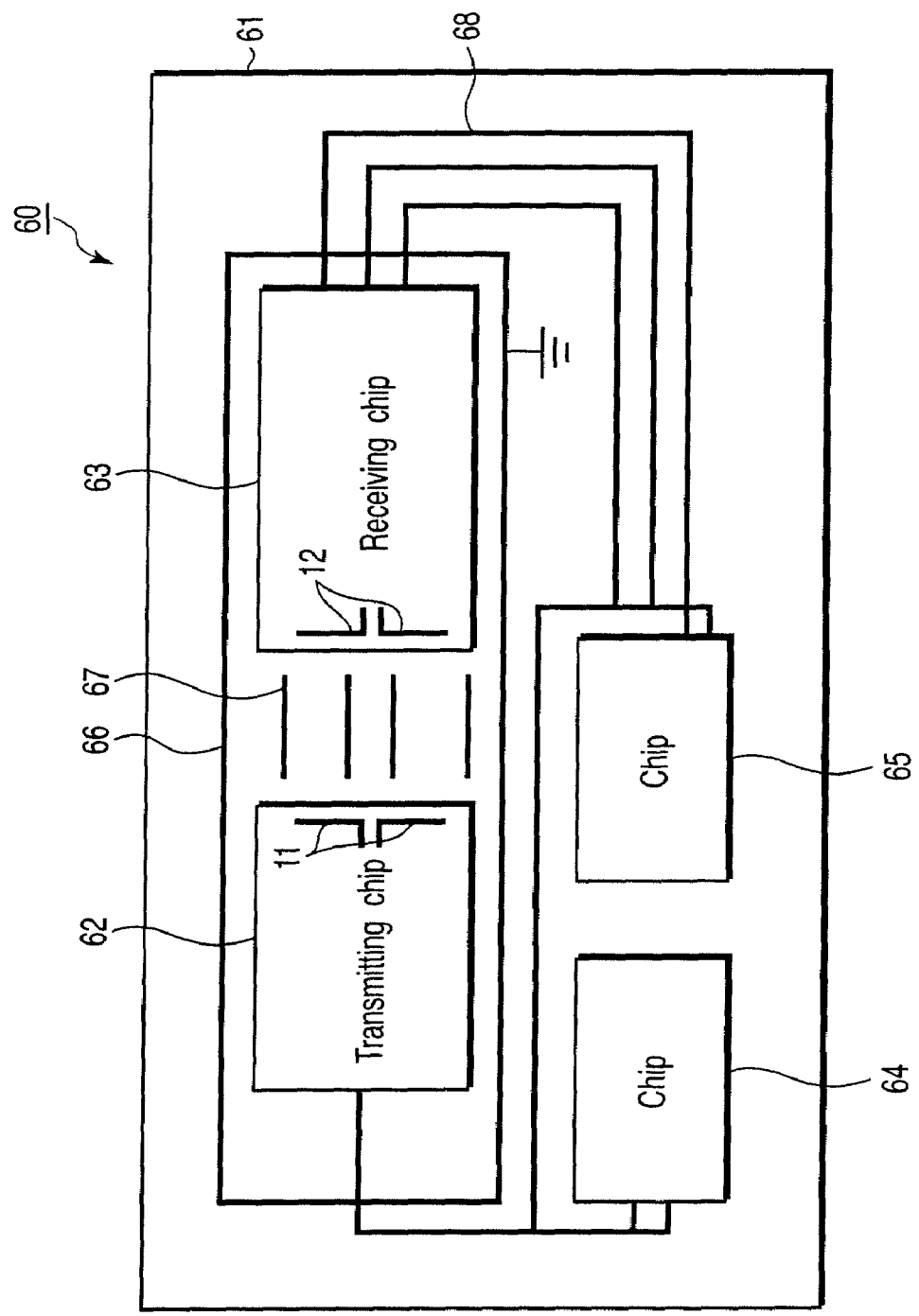
FIG. 11 is a diagram showing the structure of a semiconductor integrated circuit 60 according to the fifth embodiment of the present invention.

FIG. 11 is a diagram showing the structure of a semiconductor integrated circuit 60 according to the fifth embodiment of the present invention. The semiconductor integrated circuit 60 is formed of an MCM.

The semiconductor integrated circuit 60 includes a mother chip 61, a transmitting chip 62, a receiving chip 63, chips 64 and 65, a shield layer 66 and wiring portions 67 and 68. The transmitting chip 62, receiving chip 63, chips 64 and 65, shield layer 66 and wiring portions 67 and 68 are formed on the mother chip 61.

The transmitting chip 62 is equipped with a transmitting antenna 11, and, for example, the same circuit as the transmitting circuit 21 shown in FIG. 2 is mounted on this chip. Similarly, for example, the same circuit as the receiving circuit 22 shown in FIG. 2 is mounted on the receiving chip 63. The transmitting antenna 11 and the receiving antenna 12 each are of a dipole type and they are arranged to be in parallel with each other. With this structure, signal can be transmitted and received by the transmitting chip 62 and the receiving chip 63 with use of the transmitting antenna 11 and the receiving antenna 12, respectively. The chips 64 and 65 are formed of, for example, an MPU (micro-processing unit), memory and the like.

The shield layer 66 is provided to surround the transmitting chip 62 and the receiving chip 63. The shield layer 66 is connected to a fixed potential (for example, the ground potential). The wiring portions 67 are provided on an inner side of the shield layer 66. The wiring portions 67 are arranged to have an angle of, for example, 90 degrees with respect to the transmitting antenna 11 and the receiving antenna 12.

The wiring portions 68 which are arranged to be in parallel with the transmitting antenna 11 and the receiving antenna 12 are provided on an outer side of the shield layer 66. Further, the chips 64 and 65 are provided on an outer side of the shield layer 66.

In the semiconductor integrated circuit 60 having the above-described structure, the wiring portions 67 are not able to receive the radio wave generated from the transmitting antenna 11. Similarly, the receiving antenna 12 is not able to receive the radio wave generated from the wiring portions 67. With this structure, the interference between a group of the transmitting antenna 11 and the receiving antenna 12 and the wiring portions 67 can be suppressed.

Further, the shield layer 66 can shut the radio wave generated from the transmitting antenna 11. Also, the shield layer 66 can shut the radio wave generated from the wiring portions 68. With this structure, the interference between a group of the transmitting antenna 12 and the receiving antenna 13 and the wiring portions 68 can be suppressed.

As described above in detail, according to this embodiment, the first embodiment can be applied to an MCM. In other words, the interference between a group of the transmitting antenna 12 and the receiving antenna 13 and the wiring portion provided on the mother chip 61 can be suppressed.

It should be noted that the shield layer 66 does not necessarily have to surround the entireties of the transmitting chip 62 and the receiving chip 63. In other words, it suffices only if the shield layer 66 is arranged between a group of the transmitting antenna 11 and the receiving antenna 12, and the wiring portion set in parallel to these antennas. Even in such a case that the shield layer 66 is formed as described above, the present embodiment is applicable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a first level layer;
a transmitting linear antenna provided on the first level layer and extending in a first direction;
a receiving linear antenna provided on the first level layer and extending in the first direction;
a plurality of first wiring portions provided on the first level layer and extending in a second direction that makes an angle of 45 to 90 degrees with respect to the first direction; and
a plurality of second wiring portions provided on the first level layer and extending in the first direction; and
a first shield layer provided between a group of the transmitting linear antenna and the receiving linear antenna, and the plurality of the second wiring portions.

2. The semiconductor device according to claim 1, wherein the first shield layer surrounds the transmitting linear antenna, the receiving linear antenna and the plurality of the first wiring portions.

3. The semiconductor device according to claim 1, wherein the angle is 90 degrees.

4. The semiconductor device according to claim 1, wherein the first shield layer is connected to a fixed potential.

5. The semiconductor device according to claim 1, further comprising:
a second level layer provided over the first level layer, wherein the second level layer includes a second shield layer.

6. The semiconductor device according to claim 5, wherein the second shield layer is made of a plate.

7. The semiconductor device according to claim 5, wherein the second shield layer contains a plurality of wiring portions having intervals therebetween.

8. The semiconductor device of claim 7, wherein the intervals are smaller than wavelengths of signals.

9. The semiconductor device according to claim 5, wherein the second shield layer contains a plurality of wirings portions and the plurality of wiring portions are arranged to be in parallel with each other with intervals therebetween.

10. The semiconductor device according to claim 1, wherein the transmitting linear antenna and the receiving linear antenna face each other.

11. A semiconductor device, comprising:
a first level layer;
a transmitting linear antenna provided on the first level layer and extending in a first direction;
a receiving linear antenna provided on the first level layer, extending in the first direction and arranged to be away from the transmitting linear antenna by a first distance; and
a plurality of first wiring portions provided on the first level layer, extending in the first direction and arranged to be away from the transmitting linear antenna and the receiving linear antenna by a second distance which is larger than the first distance.

12. The semiconductor device according to claim 11, further comprising:
a second level layer provided above the first level layer; and
a plurality of second wiring portions provided on the second level layer, extending in the first direction and arranged to be away from the transmitting linear antenna and the receiving linear antenna by the second distance.

13. The semiconductor device according to claim 11, wherein the second distance is two times or more than the first distance.

* * * * *